United States Patent [19]
Zampini et al.

[11] Patent Number: 6,051,358
[45] Date of Patent: Apr. 18, 2000

[54] PHOTORESIST WITH NOVEL PHOTOACTIVE COMPOUND

[75] Inventors: Anthony Zampini, Westborough; Harold F. Sandford, Groton, both of Mass.

[73] Assignee: Shipley Company, L.L.C., Marlborough, Mass.

[21] Appl. No.: 08/963,778

[22] Filed: Nov. 4, 1997

[51] Int. Cl.[7] .................................................. G03F 7/023
[52] U.S. Cl. ........................... 430/192; 430/193; 534/557
[58] Field of Search ..................................... 430/192, 193; 534/556, 551

[56] References Cited

U.S. PATENT DOCUMENTS

| | | | |
|---|---|---|---|
| 4,614,826 | 9/1986 | Katayama et al. | 549/559 |
| 4,992,596 | 2/1991 | Jeffries, III et al. | 430/192 |
| 5,380,618 | 1/1995 | Kokubo et al. | 430/190 |
| 5,529,881 | 6/1996 | Kawabe et al. | 430/191 |
| 5,547,814 | 8/1996 | Blakeney et al. | 430/326 |
| 5,629,128 | 5/1997 | Shiraikawa et al. | 430/192 |
| 5,707,558 | 1/1998 | Inomata et al. | 430/193 |
| 5,912,102 | 6/1999 | Kawata et al. | 430/191 |

FOREIGN PATENT DOCUMENTS 0 554 101   8/1993   European Pat. Off. .

*Primary Examiner*—John S. Chu
*Attorney, Agent, or Firm*—Peter F. Corless; Darryl P. Frickey; S. Matthew Cairns

[57] ABSTRACT

An unsymetrical photoactive compound having the formula

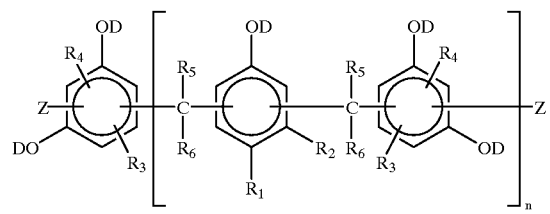

where Z is hydrogen, a hydrocarbon having from 1 to 8 carbon atoms, or halogen; D is hydrogen or diazo-oxo-naphthalene-sulfonyl; n is equal to 1 to 4; $R_1$, $R_5$ and $R_6$ are independently a hydrocarbon or halogen; $R_2$ is the same as $R_1$ or hydrogen; each $R_3$ is the same as $R_2$, hydroxyl or —OD; and each $R_4$ is the same as $R_2$ or another substituent provided that at least one $R_2$, or one or both $R_4$ is other than hydrogen, at least 2 Ds are diazo-oxo-sulfonyl group and at least 50 mole percent of the mixture conforms to the formula where n equals 1. The compounds of the invention are suitable for formation of storage stable photoresist compositions.

35 Claims, No Drawings

PHOTORESIST WITH NOVEL PHOTOACTIVE COMPOUND

BACKGROUND OF THE INVENTION

I. Introduction

This invention relates to new photoresist compositions. More particularly, this invention relates to positive working photoresist compositions containing a novel photoactive compound characterized by long term solubility in solution.

II. Description of the Prior Art

Photoresist compositions are well known in the art and described in numerous publications including DeForest, *Photoresist Materials and Processes,* McGraw-Hill Book Company, New York, 1975. Photoresists comprise coatings produced from solution or applied as a dry film which, when exposed to light of the proper wavelength, are chemically altered in their solubility to certain solvents (developers). Two types are known. The negative-acting resist is initially a mixture which is soluble in its developer, but following exposure to activating radiation, becomes insoluble in developer thereby defining a latent image. Positive-acting photoresists work in the opposite fashion, light exposure making the resist soluble in developer.

The positive-working photoresists typically comprise a light-sensitive compound in a film-forming polymer binder. The light-sensitive compounds, or sensitizers as they are often called, most frequently used are esters and amides formed from o-quinone diazide sulfonic and carboxylic acids. These esters and amides are well known in the art and are described by DeForest, supra, pp. 47–55, incorporated herein by reference. These light-sensitive compounds, and the methods used to make the same are all well documented and described in prior patents including German Patent No. 865,140 granted Feb. 2, 1953 and U.S. Pat. Nos. 2,767,092; 3,046,110; 3,046,112; 3,046,119; 3,046,121; 3,046,122; and 3,106,465, all incorporated herein by reference. Sultonic amide sensitizers that have been used in the formulation of positive-acting photoresists are shown in U.S. Pat. No. 3,637,384, also incorporated herein by reference. These materials are formed by the reaction of a suitable diazide of an aromatic sulfonyl chloride with an appropriate resin amine. Methods for the manufacture of these sensitizers and examples of the same are shown in U.S. Pat. No. 2,797,213, incorporated herein by reference. Other positive-working diazo compounds have been used for specific purposes. For example, a diazo compound used as a positive-working photoresist for deep U.V. lithography is Meldrum's diazo and its analogs is described by Clecak et al., "Technical Disclosure Bulletin," Volume 24, No. 4, September 1981, IBM Corporation, pp. 1907 and 1908, and o-quinone diazide compounds suitable for laser imaging as shown in U.S. Pat. No. 4,207,107. The aforesaid references are also incorporated herein by reference.

The resin binders most frequently used with the o-quinone diazides in commercial practice are the alkali-soluble phenol formaldehyde resins known as the novolak resins. Photoresists using such polymers are illustrated in U.K. Patent No. 1,110,017, incorporated herein by reference. These materials are the product of reaction of a phenol with formaldehyde, or a formaldehyde precursor, under conditions whereby a thermoplastic polymer is formed.

In the prior art, the above-described positive photoresists using novolak resins as binders are most often used as a mask to protect substrates from chemical etching and photoengraving processes. For example, in a conventional process for the manufacture of printed circuit boards, a copper clad substrate is coated with a layer of a positive-working photoresist, exposed to actinic radiation to form a latent circuit image in the photoresist coating, developed with a liquid developer to form a relief image, and etched with a chemical etchant whereby unwanted copper is removed and copper protected by the photoresist mask is left behind in a circuit pattern. For the manufacture of printed circuit boards, the photoresist must possess chemical resistance, must adhere to the circuit board substrate, and for high density circuits, must be capable of fine-line image resolution.

Similar photoresists are also used in the fabrication of semiconductors. As in the manufacture of printed circuits, the photoresist is coated onto the surface of a semiconductor wafer and then imaged and developed. Following development, the wafer is typically etched with an etchant whereby the portions of the water bared by the development of the photoresist are dissolved while the portions of the wafer coated with photoresist are protected, thereby defining a circuit pattern. For use in the manufacture of a semiconductor, the photoresist must possess resistance to chemical etchants, must adhere to the surface of the semiconductor wafer, must possess good thermal properties and must be capable of very fine-line image resolution.

Photoresist properties, such as those identified above, have been improved by use of photoactive compounds of increased molecular weight and having a greater number of napthoquinone diazide moieties substituted onto the compound. This has been accomplished by use of polynuclear phenols having multiple hydroxyl groups. One method has used novolak oligomers as the backbone for formation of the photoactive compound. For example, reactions between 2,6-bis(hydroxymethyl)-p-cresol and alkyl monohydric phenols to form a novolak oligomer are known. These novolak oligomers may then be reacted with a naphthoquinone diazide sulfonyl halide to form a photoactive compound used to make a positive-working photoresist. See, for example, Japanese patent publication number 62-10646 (A) assigned to Kanto Chemical Company and published Jan. 19, 1987. An exemplary novolak oligomer disclosed in this reference has the following formula:

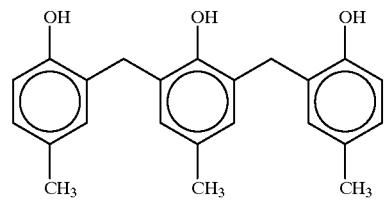

Separately, reaction between 2,6-bis(hydroxymethyl)-p-cresol and resorcinol to form oligomeric polyhydroxyphenol novolaks were reacted with epichlorohydrin or the like to form a polyglycidic ether which is capable of combination with a curing agent to form a curable epoxy resin composition. This is disclosed in U.S. Pat. No. 4,614,826 incorporated herein by reference. The reaction product of 2,6-bis(hydroxymethyl)-p-cresol and resorcinol may be represented by the following formula:

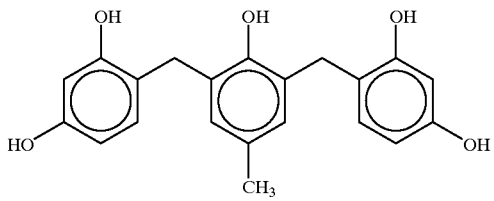

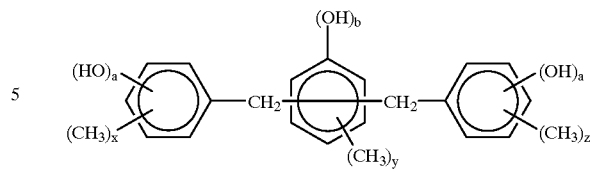

where, in accordance with the published application, each of a, b, c, x, y and z is an integer of from 1 to 3.

It is known in the art that as the size of the photoactive compound increases and the number of naphthoquinone diazide sulfonic acid substituents increases, the long term solubility of the photoactive compound in the photoresist composition decreases. The problem is exacerbated by the fact that often the photoactive compound dissolves in the photoresist composition when freshly prepared, but during storage in its container, precipitates making the photoresist unsuitable for commercial use.

The use of photoactive compounds that are condensation products of certain novolak oligomers condensed with a naphthoquinone diazide sulfonyl halide is disclosed in U.S. Pat. No. 4,992,596. These materials are formed by reacting the corresponding para-lower alkyl or halo-2,6-bis (hydroxymethyl)phenol with a polyhydroxy phenyl compound such as resorcinol or pyrogallol. This reaction is illustrated in the following reaction equation.

SUMMARY OF THE INVENTION

The present invention is directed to a positive working photoresist containing an oligomeric photoactive compound that is substantially more resistant to precipitation during storage. The photoactive compound of the invention may be represented by the following formula:

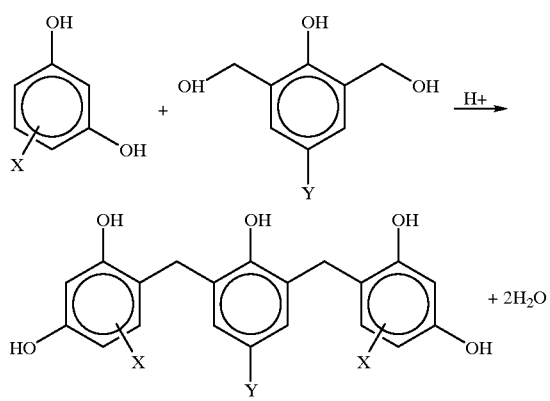

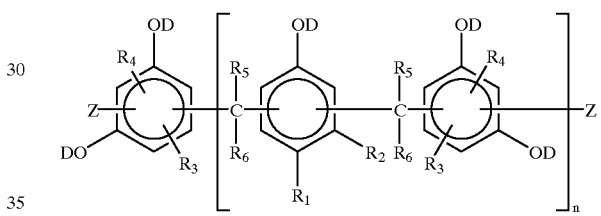

where each X is selected from the group consisting of a hydroxyl group and a halogen group, Y is selected from the group consisting of lower alkyl having from 1 to 4 carbon atoms and halogen. The photoactive compound is formed by condensing the naphthoquinone diazide sulfonyl moiety with the oligomer to form a compound having the following structure where Z is hydrogen, a hydrocarbon having from 1 to 8 carbon atoms, or halogen; D is hydrogen or a diazo naphthoquinone diazide substituent defined above; n is a whole integer equal to 1 to 4; $R_1$ is hydrocarbon having from 1 to 8 carbon atoms or halogen; $R_2$, $R_5$ and $R_6$ are independently the same as $R_1$ or hydrogen; each $R_3$ is independently the same as $R_2$, hydroxyl or —OD; and each $R_4$ is independently the same as $R_2$, alkoxy, acyl, thioether, alkylsulfone, arylsulfone or amide; provided that at least one of $R_2$, or one or both of $R_4$ is other than hydrogen, and at least 2 and preferably 3 of the D substituents are a diazo naphthoquinone diazide.

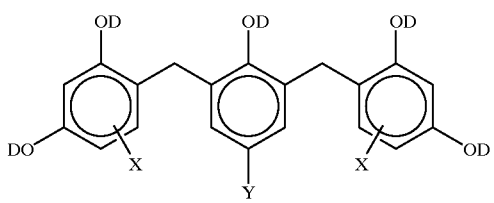

where X and Y are as defined above and D is the naphthoquinone diazide sulfonic acid.

EPO published application No. 0 554 101 A1 discloses many polyhydric phenols used as ballast groups for photoactive compound formation. One such compound may be represented by the formula:

The invention is in part based upon several discoveries. The first is that the symmetry of the prior art photoactive compound contributes to instability in storage and that breaking of the symmetry enhances stability. Another discovery of the invention that substitution of a group on the central nucleus in the next adjacent position to the $R_1$ substituent leads to greater stability. An additional discovery of the invention is that stability of the photoactive compound is improved if the photoactive compound has one or more large substitutents, methyl or larger, in a position between —OD groups, i.e., $R_4$ is methyl or larger. A further discovery is that a mixture of photoactive oligomers contributes to stability—i.e., mixed oligomers where n for a portion of the photoactive compound differs for n for another portion of the photoactive compound.

The photoactive compounds of the invention are used to make photoresists in accordance with conventional procedures such as those disclosed in the aforesaid U.S. Pat. No. 4,992,596.

DESCRIPTION OF THE PREFERRED EMBODIMENTS

One method that may be used to form the photoactive oligomers of the invention comprises reacting a bis(hydroxymethyl)phenol with a corresponding polyhydroxyphenol. This reaction is illustrated below in the reaction scheme where $R_1$, $R_2$, $R_3$, $R_4$, $R_5$ $R_6$, D and n are each as defined above.

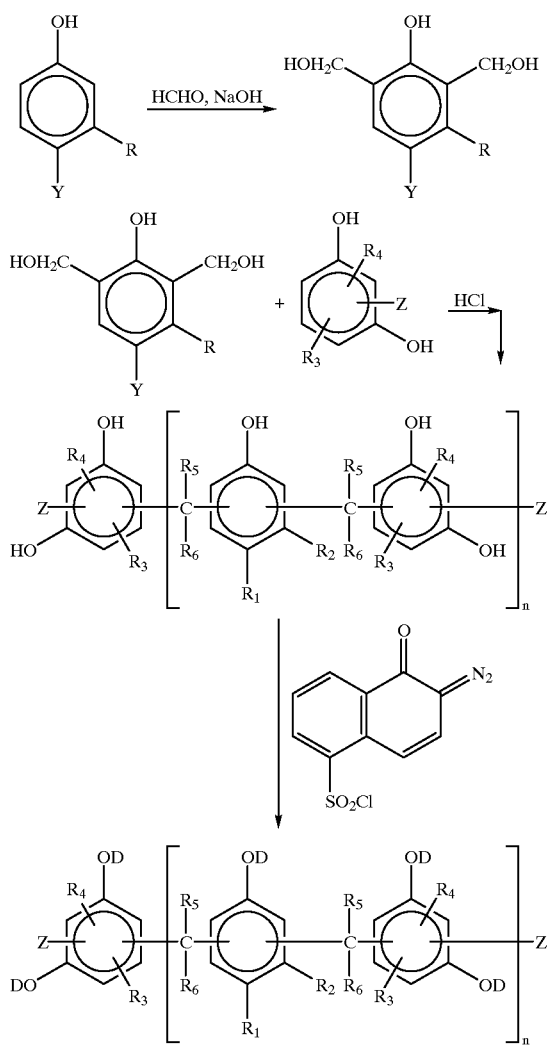

In the above reaction, it should be understood that bonding between the bis(hydroxymethyl)phenol and the polyhydroxyphenol may occur at several ring positions and that the product is most often a mixed product. Typically, the major reaction site is ortho to the hydroxyl groups.

When making the oligomers, the precursors are preferably present in the reaction vessel in a mole ratio of polyhydroxyphenol to the 2,6-bis(hydroxymethyl)phenol from about 1:1 to about 30:1 and preferably, from about 5:1 to about 15:1. The low ratio results in the formation of oligomer mixtures with a greater incidence of high molecular materials. The higher ratios induce formation of lower molecular weight materials. Adjustment of the ratio can provide a desired oligomer mixture. The preferred reaction temperature is within the range of 50° to 100° C. for about 2 to 6 hours at atmospheric pressure. Preferably, this reaction occurs in the presence of a solvent and an acid catalyst. The preferred solvent is water or a lower alcohol. Suitable acid catalysts include those commonly employed in acid condensation type reactions such as hydrochloric acid, phosphoric acid, sulfuric acid, oxalic acid, benzene sulfonic acid and toluene sulfonic acid. The most preferred catalyst is hydrochloric acid. Excess reaction time may result in undesirable rearrangements leading to undesireable biproducts.

The condensation reaction will form a mixture of oligomeric novolak species of different molecular weight. As aforesaid, when a large molar excess of the polyhydroxyphenol compound is employed, the major portion by weight of the product mixture is the trinuclear novolak oligomer. In the case of water as the reaction solvent the desired product may be recovered from the reaction mixture by first cooling to room temperature or less, then diluting the reaction mixture with more solvent and isolating the solid product by filtration. When a lower alcohol is used as the reaction solvent the reaction mixture is added to a nonsolvent such as wataer to induce precipitation of the product. After filtration, the crude product may be washed with water and directly dried or, alternatively, after isolation, may be redissolved in acetone or other solvent and filtered before solvent evaporation.

The novolak oligomers of this invention may be converted into the photoactive compounds (PACs) by condensation with o-naphthoquinone diazide sulfonyl compounds. Any o-naphthoquinone diazide sulfonyl compound used in making photoresist sensitizer may be employed herein. The most preferred o-naphthoquinone diazide sulfonyl ester moieties are derived from 3-diazo-3,4-dihydro-4-oxo-naphthalene-1-sulfonic acid chloride (also known as 1,2-naphtho-quinone-(2)-diazo-4-sulfonic acid chloride or Diazo M) or 6-diazo-5,6-dihydro-5-oxo-naphthalene-1-sulfonic acid chloride (also known as 1,2-naphthoquinone-(2)-diazo-5-sulfonic acid chloride or Diazo L). These 4- and 5-ester groups or moieties respectively have the following chemical formulae:

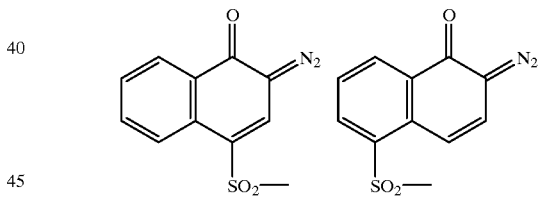

It is understood that the present invention covers the use of o-naphthoquinone diazide sulfonyl moieties singly or in mixtures in the condensation reaction with these novolak oligomers. Also, the present invention encompasses separate reactions of these novolak oligomers with different o-naphthoquinone diazide sulfonyl moieties followed by blending those reaction products together.

This condensation reaction may be carried under any conventional ester condensation conditions. Preferably, these ester compounds are prepared by first dissolving the sulfonic acid halide precursor, preferably, the sulfonic acid chloride, in a suitable solvent. Suitable solvents include acetone, dioxane, gamma-butyrolactone, methylene chloride, dimethylacetamide, N-methylpyrollidone, tetrahydrofuran and the like. The desired oligomer mixture is then added to this solution. It is advantageous to carry out this reaction in the presence of an acid-scavenging base, such as alkali metal carbonates or bicarbonates, alkaline earth metal carbonates or bicarbonates, tertiary aliphatic amines or pyridine or pyridine derivatives.

The esterification products of this reaction may be recovered from the reaction mixture by any conventional means, preferably by precipitation into acidified water, followed by filtration and drying.

A, major object of the invention is to provide a photoresist composition that is stable during storage. To do so, it is necessary to provide a photoactive compound that will not precipitate during storage. One method for enhancing stability is to use a mixture of oligomers of differing molecular weights. In this respect, in a preferred embodiment of the invention, a major portion of the photoactive mixture would be a trinuclear oligomer and a minor portion of the mixture would be a higher weight material, i.e., where n in the above formula is in excess of 1. In the more preferred embodiment of the invention, the trinuclear oligomer would comprise from 60 to 98 mole percent of the oligomer mixture, most preferably from 86 to 95 mole percent, and the higher molecular weight oligomer would comprise the balance of tile mixture.

The preferred sensitizer in accordance with the invention is one that conforms to the following formula:

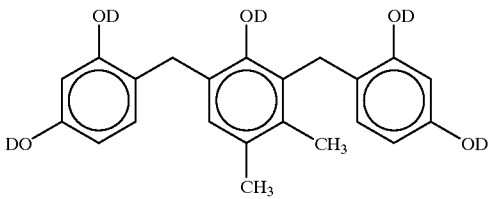

In the preferred photoactive compound, D is most preferably 6-diazo-5,6-dihydro-5-oxo-naphthalene-1-sulfonic acid chloride with the proviso that at least 3 of the Ds are sulfonyl moieties.

At least one of the photoactive compounds of the present invention may be mixed with an alkali-soluble resin or resins to make radiation sensitive mixtures which are useful as positive-working photoresist compositions. The term alkali-soluble resin is used herein to means a resin which will dissolve completely in an aqueous alkaline developing solution conventionally used with positive-working photoresist compositions. Suitable alkali-soluble resins include phenol-formaldehyde novolak resins, cresol-formaldehyde novolak resins and polyvinyl phenol resins, preferably having a molecular weight of about 500 to about 40,000, and more preferably from about 800 to 20,000. These novolak resins are preferably prepared by the condensation reaction of phenol or cresols with formaldehyde and are characterized by being light-stable, water-insoluble, alkali-soluble and film-forming. The most preferred class of novolak resins is formed by the condensation reaction between a mixture of meta- and para-cresols with formaldehyde having a molecular weight of about 1,000 to about 10,000. the preparation of examples of such suitable resins is disclosed in U.S. Pat. Nos. 4,377,631; 4,529,682; and 4,587,196, all which issued to Medhat Toukhy and are incorporated herein by references in their entireties.

Other photoactive compounds may also be added to the radiation sensitive mixtures of the present invention. These other photoactive compounds may include o-quinonediazide esters derived from polyhydric phenols, alkyl-polyhydroxyphenones, aryl-polyhydroxyphenones, and the like which can contain up to six or more sites for esterification. The most preferred o-quinonediazide esters are derived from 3-diazo-3,4-dihydro-4-oxo -naphthalene-1-sulfonic acid chloride and 6-diazo-5,6-dihydro-5-oxo-naphthalene-1-sulfonic acid chloride. When other photoactive compounds are used in radiation sensitive mixtures besides the photoactive compounds of the present invention, the amount of photoactive compounds of the present invention should be at least about 5% by weight, preferably 10–100% by weight of the total photoactive compounds present.

The proportion of the photoactive compound in the radiation sensitive mixture may preferably range from about 5 to about 40%, more preferably from about 10 to about 25% by weight of the non-volatile (e.g. non-solvent) content of the radiation sensitive mixture. The proportion of total binder resin of this present invention in the radiation sensitive mixture may preferably range from about 60 to about 95% more preferably from about 75 to 90% of the non-volatile (e.g. excluding solvents) solids content of the radiation sensitive mixture.

These radiation sensitive mixtures may also contain conventional photoresist composition ingredients such as solvents, actinic and contrast dyes, anti-striation agents, plasticizers, speed enhancers, and the like. These additional ingredients may be added to the binder resin and photoactive compound before the solution is coated onto the substrate.

The prepared radiation sensitive resist mixture, can be applied to a substrate by any conventional method used in the photoresist art, including dipping, spraying, whirling and spin coating. When spin coating, for example, the resist mixture can be adjusted as to the percentage of solids content in order to provide a coating of the desired thickness given the type of spinning equipment and spin speed utilized and the amount of time allowed for the spinning process. Suitable substrates include silicon, aluminum or polymeric resins, silicon dioxide, doped silicon dioxide, silicon resins, gallium arsenide, silicon nitride, tantalum, copper, polysilicon, ceramics and aluminum/copper mixtures. The coating surfaces of these substrates may or may not be primed with the conventional adhesion promoter (e.g. hexamethyldisilazane) before the photoresist coating is applied and may or may not have been precoated with an underlying antireflective coating.

The photoresist coatings produced by the above described procedure are particularly suitable for application to silicon wafers coated with a silicon dioxide or silicon nitride layer such as are utilized in the production of microprocessors and other miniaturized integrated circuit components. An aluminum or aluminum coated substrates may be used as well. The substrate may also comprise various polymeric resins especially transparent polymers such as polyesters and polyolefins.

After the resist solution is coated onto the substrate, the coated substrate is baked at approximately 70° C. to 125° C. until substantially all the solvent has evaporated and only a uniform radiation sensitive coating remains on the substrate.

The coated substrate can then be exposed to radiation, especially ultraviolet radiation, in any desired exposure pattern, produced by use of suitable masks, negatives, stencils, templates, and the like. Conventional imaging process or apparatus currently used in processing photoresist-coated substrates may be employed with the present invention. While ultraviolet (UV) light is the preferred source of radiation, other sources of radiation such as visible light, electron or ion beam and x-ray radiant energy may be instead used.

The exposed resist-coated substrates are preferably subjected to a post exposure bake at a temperature from about 90° C. to about 120° C. from about 30–300 seconds to enhance image quality and resolution.

The exposed resist-coated substrates are next developed in an aqueous alkaline developing solution. This solution is preferably agitated, for example, by nitrogen gas agitation. Examples of aqueous alkaline developers include aqueous solutions of tetramethylammonium hydroxide, sodium hydroxide, potassium hydroxide, ethanolamine, choline, sodium phosphates, sodium carbonate, sodium metasilicate, and the like. The preferred developers for this invention are aqueous solutions of either alkali metal hydroxides phosphates or silicates, or mixtures thereof, or tetramethylammonium hydroxide.

Alternative development techniques such as spray development or puddle development or combinations thereof, may also be used.

The substrates are allowed to remain in the developer until all of the resist coating has dissolved from the exposed areas. Normally, development times from about 10 seconds to about 3 minutes are employed.

After selective dissolution of the coated wafers in the developing solution, they are preferably subjected to a deionized water rinse to fully remove the developer or any remaining undesired portions of the coating and to stop further development. This rinsing operation (which is part of the development process) may be followed by blow drying with filtered air to remove excess water. A post-development heat treatment or bake may then be employed to increase the coating's adhesion and chemical resistance to etching solutions and other substances. The post-development heat treatment can comprise the baking of the coating and substrate below the coating's thermal deformation temperature.

In industrial applications, particularly in the manufacture of microcircuitry units on silicon/silicon dioxide-type substrates, the developed substrates may then be treated with a buffered hydrofluoric acid etching solution or plasma gas etch. The resist compositions of the present invention are believed to be resistant to a wide variety of acid etching solutions or plasma gases and provide effective protection for the resist coating areas of the substrate.

Later, the remaining areas of the photoresist coating may be removed from the etched substrate surface by conventional photoresist stripping operations.

The present invention is further described in detail by means of the following Examples. All parts and percentages are by weight unless explicitly stated otherwise.

EXAMPLE 1

Preparation of 2,6-bis(2,4-dihydroxybenzyl)-p-cresol

To a 5 L 3-necked flask equipped with a reflux condenser was added 2.1 L of methanol, 754 g of resorcinol, 215 g of 2,6-bis(hydroxymethyl)-p-cresol and 4.38 g of p-toluenesulfonic acid monohydrate. The solution was then heated to and kept at reflux for 20 hours. A distillation head was added to the flask and 1.1 L of methanol removed by distillation over a one hour period. The reaction mixture was then slowly added over a 30 minute period using an addition funnel into 20 L of de-mineralized water. The precipitate was slurried for one hour and then collected using a Buchner funnel. The crude product was added to 6 L de-mineralized water, heated to 85–87° C. and slurried for 20 minutes at this temperature. The suspension was vacuum filtered while at 85° C. and the filtrate allowed to cool to ambient temperature overnight. The filtrant was again extracted with 3.0 L of de-mineralized water for 20 minutes at 85° C., the mixture was vacuum filtered and cooled. The precipitates from the filtrates were collected on a Buchner and vacuum oven dried at 100° C. A combined yield of 158 g was obtained having a purity of about 91 % as determined by HPLC analysis.

EXAMPLE 2

Preparation of 2,6-Bis(2,4-dihydroxybenzyl)-4-ethylphenol

To a 2 liter round bottom flask was added 800 ml of de-mineralized water, 825.0 g resorcinol and 45.58 g of 2,6-bis(hydroxymethyl)-4-ethylresorcinol. 6.5 ml of concentrated hydrochloric acid was added and the mixture stirred overnight at ambient conditions. The reaction mixture was then added to 12 L of de-mineralized water and slowly stirred at room temperature for 24 hours. The precipitate was isolated by vacuum filtration and washed with de-mineralized water. It was air dried for 24 hours and then vacuum oven dried at 60° C. for 18 hours. About 39.3 g of product was obtained having a purity of about 91% as determined by HPLC analysis.

EXAMPLE 3

Preparation of 2,6-Bis(2,4-dihydroxybenzyl)-3,4-dimethylphenol

In a one liter reaction flask were dissolved 220.0 g of resorcinol in 300 ml of de-mineralized water. To this solution 18.22 g of 2,6-bis(hydroxymethyl)-3,4-dimethylphenol was added and stirred until it dissolved. 5 ml of concentrated hydrochloric acid was then added and the reaction mixture stirred at ambient temperature for about 15 hours. The mixture was then chilled to −12° C. and the crystalline precipitate isolated in a chilled Buchner funnel. The crude product was suspended in 300 ml of de-mineralized water and re-isolated by vacuum filtration. The wet solid was first partially air dried and then vacuum oven dried at 60° C. to yield 20.4 g product having a purity of about 95% as determined by HPLC.

EXAMPLE 4

Preparation of 2,6-Bis(2,4-dihydroxy-3-methylbenzyl)-4-methylphenol

To a one liter flask was added 500 ml of methanol, 102.6 g of 2-methylresorcinol, 17 g of 2,6-bis(hydroxymethyl)-4-methylphenol and 10 ml of concentrated hydrochloric acid. The mixture was heated at reflux for 24 hours, cooled and slowly poured into 3 L of de-mineralized water to precipitate the crude product. After the product was collected by filtration it was washed with a copious amount of water, dissolved into 3.5 L of hot water, and the mixture filtered while hot. The filtrate was cooled to ambient temperature and the crystals collected by filtration and dried. The filtrant was extracted with hot water four more times to give a total of 23.2 g of product having a purity greater than 94% as determined by HPLC.

EXAMPLE 5

Preparation of 2,6-Bis(2,4-dihydroxy-5-hexylbenzyl)-4-methylphenol

To 500 ml flask was added 300 ml of methanol, 60 g of 4-hexylresorcinol and 16.9 g of 2,6-bis(hydroxymethyl)-4-methylphenol. 2.2 g of toluenesulfonic acid monohydrate was then added and the reaction solution heated at reflux for 20.5 hours. The warm reaction solution was slowly added, with agitation, to about 1.5 L of de-mineralized water containing about 1.3% hydrochloric acid. To the precipitate mixture an additional 20 ml of concentrated hydrochloric acid was added and mixed until the precipitate solidified. The crude product was collected on a filter, reduced to small pieces and air dried while gently warmed on a hot plate. To the crude product 200 ml of toluene was added and the mixture heated to about 85° C. The hot solution was filtered using a pre-heated Buchner funnel and the filtrate allowed to stand at room temperature. The crystals were collected on the filter, rinsed and slurred in 50 ml of cold toluene. After collection and drying about 16.5 g of product was obtained having a purity of about 95% as determined by HPLC.

EXAMPLE 6

Preparation of 2,6-Bis(2,4-dihydroxy-5-ethylbenzyl)-4-methylphenol

To a 300 ml flask was added 200 ml of methanol, 31.3 g of 4-ethylresorcinol and 2.0 g of toluenesulfonic acid monohydrate. To the solution 16.9 g of 2,6-bis(hydroxymethyl)-4-methylphenol was added in parts over a 3 hours period. The reaction solution was then heated at reflux for 18 hours followed by addition into a mixture of 1.5 L de-mineralized water and 40 ml of concentrated hydrochloric acid to precipitate the product. The product was collected on a filter, rinsed and air dried. It was then mixed with 200 ml of toluene, heated to about 90° C. and the hot mixture filtered through a preheated funnel. To the filtrant 200 ml of toluene was added and the mixture again heated to about 90° C. before it was filtered hot. The two filtrates were combined and set aside to allow the product to crystallize as the solution cooled to ambient temperature. About 7.6 g of product was recovered by filtration having a purity of about 92% as determined by HPLC. To the filtrate 100 ml of toluene was added and the solution allowed to stand over the weekend under ambient conditions. About 6.05g of additional product was recovered having a purity of about 84% as determined by HPLC.

EXAMPLE 7

Diazonaphthoquinone sulfonyl esters of 2,6-bis(2,4-dihydroxybenzyl)-p-cresol

To a five liter reactor was added 3500 ml of acetone, 150.9 g 2,6-bis(2,4-dihydroxybenzyl)-p-cresol prepared according to Example 1 and 483.6 g of 2-diazo-1-naphthol-5-sulfonyl chloride. The mixture was mixed to dissolve all of the components and warmed to 25° C. A solution comprising of 218.6 g triethylamine and 500 ml acetone was added drop wise to the reaction mixture over a one hour period while the reaction temperature was kept at 25° C. After mixing for an additional 30 minutes the reaction mixture was neutralized with 35 ml concentrated hydrochloric acid and the insoluble salts removed by filtration. The filtrate was then slowly added to a solution of 20 L of de-mineralized water and 80 ml of concentrated hydrochloric acid to precipitate the product. The product was isolated by filtration, washed with de-mineralized water and dried at 50° C. under vacuum. About 548 g of product was obtained having an ester distribution of about 56.7% tetra ester and 28.7% penta ester as determined by HPLC.

EXAMPLES 8 to 12

Under similar reaction conditions other 1,2-naphthoquinione-(2)-diazide-5-sulfonic acid esters of the invention were prepared. Table 1 sets out the precursor compound used, tetra and penta ester content of the resulting mixed esters.

| Example | Precursor Compound Synthesis Procedure According to | Tetra Ester % | Penta Ester % |
|---|---|---|---|
| 8 | Example 2 | 51.6 | 36.3 |
| 9 | Example 3 | 63.2 | 29.5 |
| 10 | Example 4 | 23.6 | 68.7 |
| 11 | Example 5 | 32.6 | 57.8 |
| 12 | Example 6 | 27.7 | 66.3 |

EXAMPLES 13 to 18

The following demonstrates the solubility and solution stability of the of the mixed esters prepared according to examples 7 through 12. Each of the mixed esters was tested for solubility solvent mixture comprising of 90 percent ethyl lactate, 5 percent butyl acetate, and 5 percent xylene according to the following protocol. Before use the solvent was filtered through a 0.2 micron filter. A sample of each example ester was mixed with nineteen times its weight of solvent in a micro cleaned bottle. The resulting mixture was rolled on a roller mill until dissolution was complete or it became obvious that an ester was insoluble. The resulting solution was transferred to three 4 ml vials with Teflon cap liners. The vials were placed in opaque plastic bottles and then stored at ambient temperature, 35° C. and 45° C. The solutions were then checked on a regular schedule with the naked eye and under the microscope for the presence of particles.

| Exam-ples | Diazide Sulfonic Acid Ester of Example | Time Particles Observed in Hours | | |
|---|---|---|---|---|
| | | Room Temperature | 35° C. | 45° C. |
| 13 | 7 | 138 | 65 | 65 |
| 14 | 8 | Not Soluble | — | — |
| 15 | 9 | >2064 | ND | ND |
| 16 | 10 | >1558 | >1558 | 129 |
| 17 | 11 | >2416 | >2416 | >2416 |
| 18 | 12 | >3119 | >3119 | 528 |

EXAMPLES 19 to 21

The following examples illustrate the preparation and use of photoresists containing tile novel esters in accordance with the invention. Examples 19 to 21 demonstrate positive-working photoresist compositions containing the novel esters of the invention. The photoresist compositions were evaluated by spin coating onto four-inch silicon wafers using either a GCA or SVG wafer coater-hot plate track to give approximately a 9700 Å25 Å film of resist and baked at 85° to 90° C. for 60 seconds. Initial average film thickness was measured with a Nanometrics 215 instrument. The films were irradiated using a GCA XLS, 0.55 NA [-line stepper and then subjected to a post-exposure bake of 110 to 115° C. for 60 seconds. The exposed resists were developed with MF701 or MF703 developer (Shipley Co. products) at 21° C. for 60 seconds using a single puddle process. Scanning electron microscopy was used to analyze the resist films in the exposed and unexposed regions and to determine performance characteristics.

EXAMPLE 19

| Resist Composition | |
|---|---|
| Cresol-formaldehyde resin[1] | 9.83 g |
| PAC of Example 7 | 1.92 g |
| Solvent[2] | 40.3 g |
| Performance | |
| Photospeed(mj/cm$^2$) @ 0.35 μm | 128 |
| Ultimate resolution(μm) | 0.330 |
| Wall angle(degree) | 87.4 |

EXAMPLE 20

| Resist Composition | |
|---|---|
| Cresol-formaldehyde resin[1] | 9.83 g |
| PAC of Example 10 | 2.18 g |
| Solvent[2] | 40.2 g |
| Performance | |
| Photospeed(mj/cm$^2$) @ 0.35 μm | 129 |
| Ultimate resolution(μm) | 0.345 |
| Wall angle(degree) | 88 |

EXAMPLE 21

| Resist Composition | |
|---|---|
| Cresol-formaldehyde resin[1] | 15.07 g |
| Cresol-aromatic aldehyde resin[3] | 5.03 g |
| PAC of Example 12 | 3.92 g |
| Solvent[2] | 64.4 g |
| Performance | |
| Photospeed(mj/cm$^2$) @ 0.45 μm | 185 |
| Ultimate resolution(μm) | 0.34 |
| Depth of Focus(μm) | 1.6 |
| Wall angle(degree) | 84.5 |

[1]Resin composed of m-cresol, p-cresol, o-cresol and formaldehyde
[2]A solvent mixture comprising of ethyl lactate, anisole and amyl acetate
[3]Resin composed of m-cresol, benzaldehyde and salicylaldehyde

What is claimed is:

1. A compound having the formula:

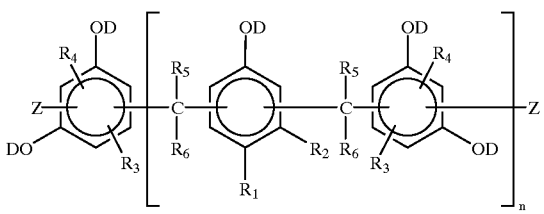

where Z is hydrogen, a hydrocarbon having from 1 to 8 carbon atoms, or halogen; D is hydrogen or a diazo-oxo-naphthalene-sulfonyl group; n is a whole integer equal to 1 to 4; $R_1$ is a hydrocarbon having from 1 to 8 carbon atoms or halogen; $R_2$, $R_5$ and R6 are the same as $R_1$ or hydrogen; each $R_3$ is independently the same as $R_2$, hydroxy or —OD; and each $R_4$ is independently the same as $R_2$, alkoxy, acyl, alkylsulfone, arylsulfone or amide; provided that at least one of $R_2$, or one or both of $R_4$ is other than hydrogen and at least 2 of the D substituents are a diazo-oxo-sulfonyl group, and $R_2$ is a hydrocarbon.

2. The compound of claim 1 where $R_2$ is aliphatic.
3. The compound of claim 1 where $R_2$ is methyl.
4. The compound of claim 1 where at least one $R_4$ is a hydrocarbon.
5. The compound of claim 4 where $R_4$ is aliphatic.
6. The compound of claim 4 where $R_4$ is methyl.
7. The compound of claim 1 where $R_2$ and $R_4$ are each hydrocarbon.
8. The compound of claim 1 where $R_2$ and $R_4$ are each aliphatic.
9. The compound of claim 1 where $R_2$ and $R_4$ are each methyl.
10. The compound of claim 1 having the formula:

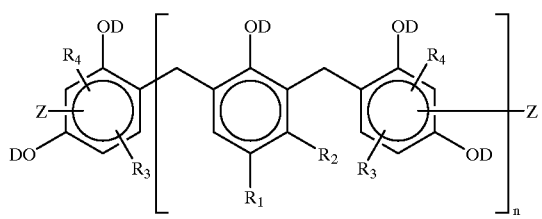

where Z is hydrogen, a hydrocarbon having from 1 to 8 carbon atoms, or halogen; D is hydrogen or a diazo-oxo-naphthalene-sulfonyl group; n is a whole integer equal to 1 to 4; $R_1$ is a hydrocarbon having from 1 to 8 carbon atoms or halogen; $R_2$ is the same as $R_1$ or hydrogen; each $R_3$ is independently the same as $R_2$, hydroxyl or —OD; and each $R_4$ is independently the same as $R_2$, alkoxy, acyl, thioether, alkylsulfone, arylsulfone or amide; provided that at least one of $R_2$, or one or both of $R_4$ is other than hydrogen, at least 2 of the D substituents are a diazo-oxo-sulfonyl group and at least 50 mole percent of the mixture conforms to the formula where n equals 1 and at least 2 mole percent of the mixture conforms to the formula where n is greater than 1.

11. A mixture of compounds where each compound of the mixture conforms to the formula:

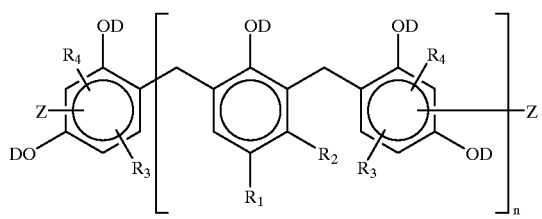

where Z is hydrogen, a hydrocarbon having from 1 to 8 carbon atoms, or halogen; D is hydrogen or a diazo-oxo-naphthalene-sulfonyl group; n is a whole integer equal to 1 to 4; $R_1$ is a hydrocarbon having from 1 to 8 carbon atoms or halogen; $R_2$, $R_5$ and $R_6$ are the same as $R_1$ or hydrogen; each $R_3$ is independently the same as $R_2$, hydroxy or —OD; and each $R_4$ is independently the same as $R_2$, alkoxy, acyl, alkylsulfone, arylsulfone or amide; provided that at least one of $R_2$, or one or both of $R_4$ is other than hydrogen and at least 2 of the D substituents are a diazo-oxo-sulfonyl group, and $R_2$ is a hydrocarbon.

12. The compound of claim 11 where $R_3$ and $R_4$ are each hydrogen.
13. The compound of claim 11 where $R_2$ is methyl.
14. The compound of claim 11 where at least one $R_4$ is a hydrocarbon.

15. The compound of claim 14 where $R_4$ is aliphatic.

16. The compound of claim 14 where $R_4$ is methyl.

17. A photoresist comprising an alkali soluble resin and a photoactive compound having the formula:

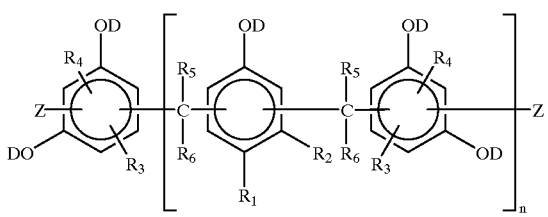

where Z is hydrogen, a hydrocarbon having from 1 to 8 carbon atoms, or halogen; D is hydrogen or a diazo-oxo-naphthalene-sulfonyl group; n is a whole integer equal to 1 to 4; $R_1$ is a hydrocarbon having from 1 to 8 carbon atoms or halogen; $R_2$, $R_5$ and $R_6$ are the same as $R_1$ or hydrogen; each $R_3$ is independently the same as $R_2$, hydroxy or —OD; and each $R_4$ is independently the same as $R_2$, alkoxy, acyl, alkylsulfone, arylsulfone or amide; provided that at least one of $R_2$, or one or both of $R_4$ is other than hydrogen and at least 2 of the D substituents are a diazo-oxo-sulfonyl group, and $R_2$ is a hydrocarbon.

18. The photoresist of claim 17 where the resin is a novolak resin.

19. The photoresist of claim 18 where $R_3$ and $R_4$ are each hydrogen.

20. The photoresist of claim 19 where $R_2$ is aliphatic.

21. The photoresist of claim 19 where $R_2$ is methyl.

22. The photoresist of claim 19 where at least one $R_4$ is a hydrocarbon.

23. The photoresist of claim 22 where $R_4$ is aliphatic.

24. The photoresist of claim 22 where $R_4$ is methyl.

25. The photoresist of claim 18 where $R_2$ and $R_4$ are each hydrocarbon.

26. The photoresist of claim 18 where $R_2$ and $R_4$ are each aliphatic.

27. The photoresist of claim 18 where $R_2$ and $R_4$ are each methyl.

28. A photoresist comprising an alkali soluble resin and a mixture of photoactive compounds where each component of the mixture conforms to the formula:

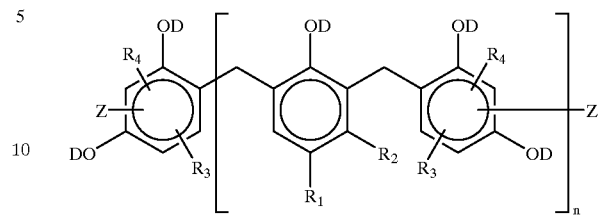

where Z is hydrogen, a hydrocarbon having from 1 to 8 carbon atoms, or halogen; D is hydrogen or a diazo-oxo-naphthalene-sulfonyl group; n is a whole integer equal to 1 to 4; $R_1$ is a hydrocarbon having from 1 to 8 carbon atoms or halogen; $R_2$, $R_5$ and $R_6$ are the same as $R_1$ or hydrogen; each $R_3$ is independently the same as $R_2$, hydroxy or —OD; and each $R_4$ is independently the same as $R_2$, alkoxy, acyl, alkylsulfone, arylsulfone or amide; provided that at least one of $R_2$, or one or both of $R_4$ is other than hydrogen and at least 2 of the D substituents are a diazo-oxo-sulfonyl group, and $R_2$ is a hydrocarbon and at least 50 mole percent of the mixture conforms to the formula where n equals 1 and at least 2 mole percent of the mixture conforms to the formula where n is greater than 1.

29. The photoresist of claim 28 where the resin is a novolak resin.

30. The photoresist of claim 29 where $R_3$ and $R_4$ are each hydrogen.

31. The photoresist of claim 28 where $R_2$ is aliphatic.

32. The photoresist of claim 28 where $R_2$ is methyl.

33. The photoresist of claim 29 where at least one $R_4$ is a hydrocarbon.

34. The photoresist of claim 33 where $R_4$ is aliphatic.

35. The photoresist of claim 33 where $R_4$ is methyl.

* * * * *